United States Patent [19]
Yeh

[11] Patent Number: 4,998,060
[45] Date of Patent: Mar. 5, 1991

[54] FAULT INDICATOR WITH HOT STICK CLAMPING MECHANISM

[75] Inventor: Thomas Yeh, South Weymouth, Mass.

[73] Assignee: Pacific Scientific Company, Weymouth, Mass.

[21] Appl. No.: 379,042

[22] Filed: Jul. 12, 1989

[51] Int. Cl.⁵ .................. G01R 1/22; G01R 31/08
[52] U.S. Cl. .................. 324/127; 324/117 R; 324/522; 336/176
[58] Field of Search ............ 324/127, 117 R, 522, 324/543, 133; 336/175, 176

[56] References Cited

U.S. PATENT DOCUMENTS

| 750,525 | 1/1904 | Everest | 324/127 |
| 2,165,290 | 7/1939 | Mitchell | 324/127 |
| 3,102,988 | 9/1963 | Hoffman | 324/127 |
| 3,114,880 | 12/1963 | Medlar | 324/127 |
| 3,253,215 | 5/1966 | Moakler et al. | 324/127 |
| 3,453,544 | 7/1969 | Schweitzer, Jr. | 324/127 |

FOREIGN PATENT DOCUMENTS

| 10741 | of 1971 | Japan | 324/127 |
| 2099159 | 12/1982 | United Kingdom | 324/127 |
| 24217 | of 1983 | United Kingdom | 324/127 |

Primary Examiner—Ernest F. Karlsen
Attorney, Agent, or Firm—Stanger, Michaelson, Spivak & Wallace

[57] ABSTRACT

In the disclosed fault detector, a casing has a u-shaped portion for receiving a cable and a portion extending from the u-shaped portion. A screw is mounted on said portion. A pressure device is mounted on the end of the screw and directed toward the u-shaped portion for holding the cable in the u-shaped portion. A magnetic lamination passes through the u-shaped portion. The pressure device is made of a magnetic material and a coil surrounds said laminations.

6 Claims, 3 Drawing Sheets

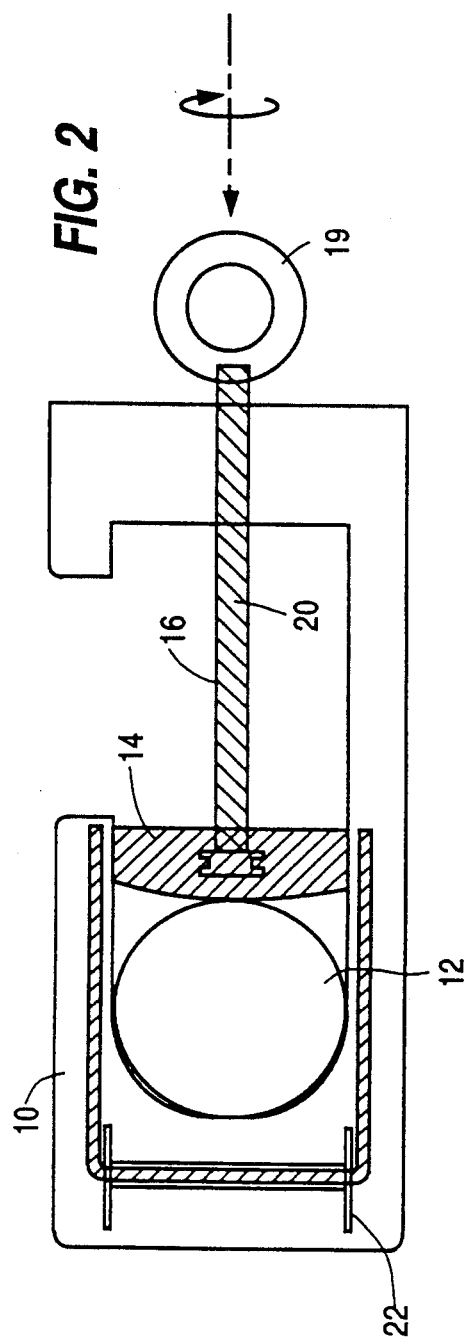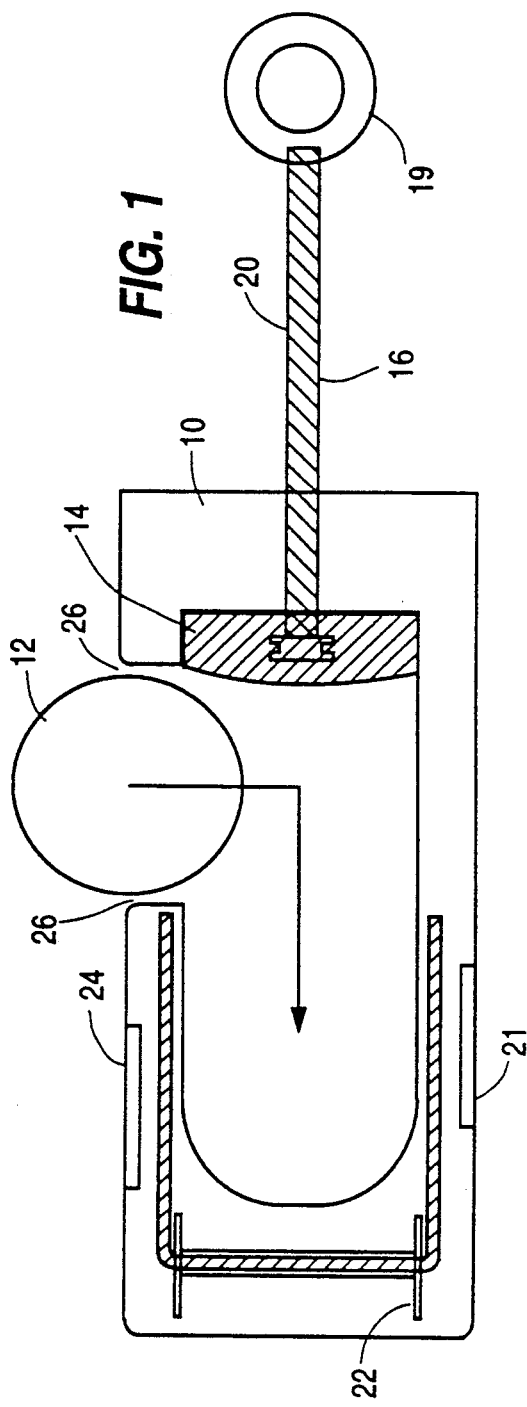

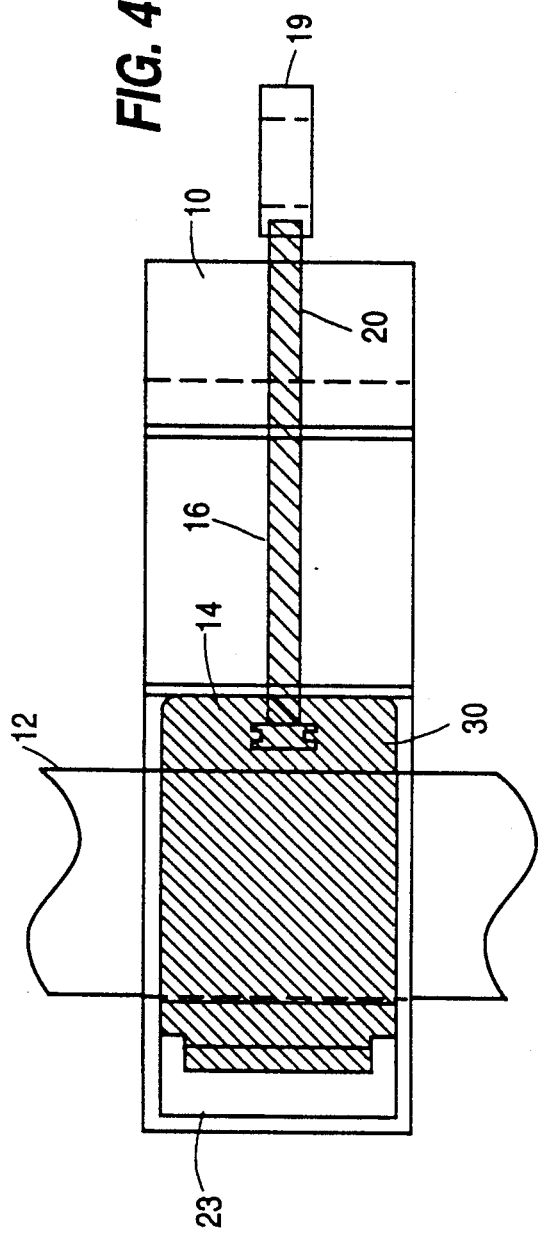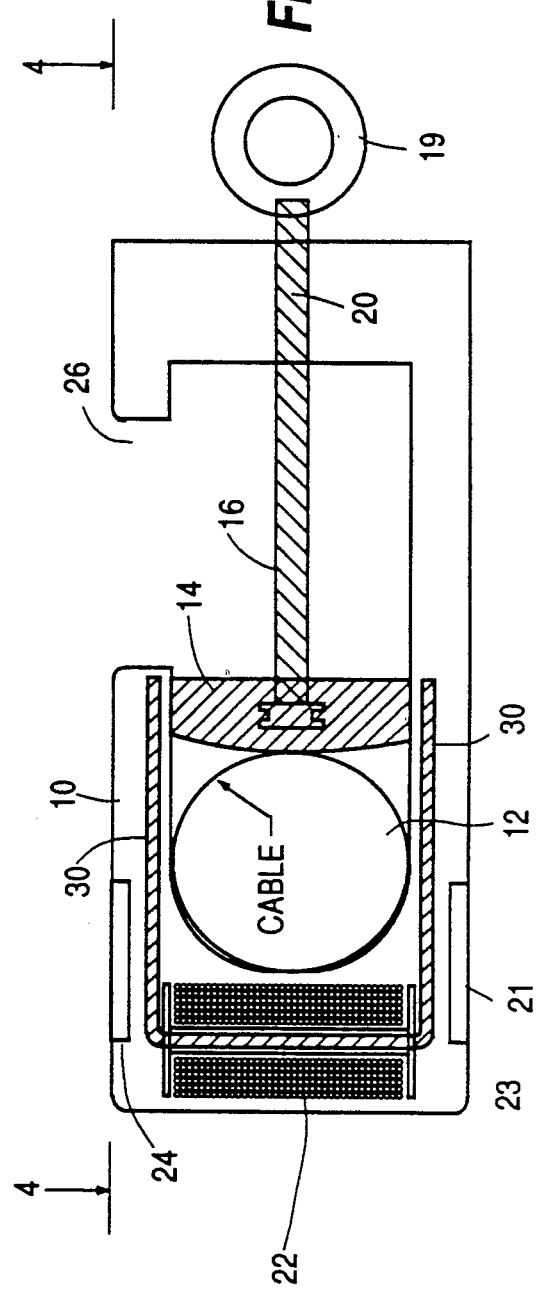

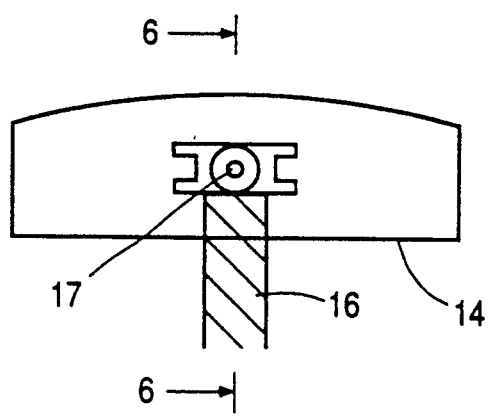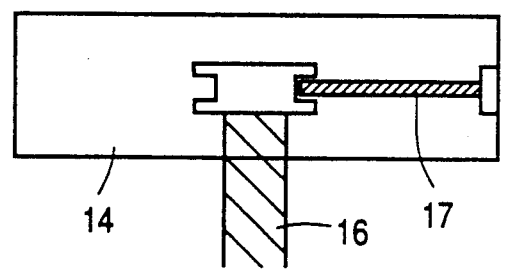
FIG. 5  FIG. 6

FAULT INDICATOR WITH HOT STICK CLAMPING MECHANISM

BACKGROUND OF THE INVENTION

This invention relates to faulted current indicators, and particularly to faulted current indicators having hot stick clamping mechanisms for mounting the fault indicators onto current carrying cables.

Prior art faulted current indicators include a magnetic lamination surrounding the cable whose current is to be monitored, a coil inductively interlinked with the magnetic lamination for the purpose of producing a voltage corresponding to the current in the cable, and a circuit for analyzing the current in the cable and tripping and resetting a "target" which indicates the fault status of current in the cable.

Prior faulted current indicators use hot stick mechanisms for securing the indicators onto current carrying cables. However, these result in inefficient use of materials.

OBJECTS AND ADVANTAGES OF THE INVENTION

An object of the invention is to improve faulted current indicators.

According to a feature of the invention, a case containing a magnetic lamination and a coil surrounding the lamination forms a u-shaped recess for receiving the cable and an extension on one of the legs carries a threaded screw for forcing the cable into the u-shaped opening.

According to another feature of the invention, the case also contains the analytic circuitry.

According to another feature of the invention, the case also contains the target which displays the set or reset condition of the indicator.

These and other features of the invention are pointed out in the claims. Other objects and advantages of the invention will become evident from the following detailed description when read in light of the accompanying drawings.

BRIEF DESCRIPTION OF THE DRAWINGS

In the drawings:

FIG. 1 is a sectional view of a faulted current indicator embodying features of the invention in its open position.

FIG. 2 is a sectional view of the faulted current indicator in its closed position clamping on to a cable.

FIG. 3 is a sectional view of the faulted current indicator in FIG. 2 showing extra details.

FIG. 4 is a sectional view 4—4 of the faulted current indicator in FIG. 3.

FIG. 5 is a sectional view of the pressure pad adjustment screw attachment in the faulted current indicators of FIGS. 1 to 4.

FIG. 6 is a section view 5—5 of FIG. 5.

DETAILED DESCRIPTION OF PREFERRED EMBODIMENTS

The indicators of FIGS. 1 to 6 include a case 10 that is "hooked" onto the power cable 12. A movable pressure pad 14 is then tighten into position for applying the clamping force that secures the attachment. The pressure pad 14 is fastened to an adjustment screw 16 by a horizontal adjustment screw pin 17 which also serves as a bearing allowing the screw to turn about threads 20 while the pressure pad is moved only in the vertical direction. A hot stick hook ring is identified as 19.

The case 10 is also used to house the circuitry 21 of the fault indicator. A sensor 22, either a reed switch or an induction coil on a coil bobbin 23, is contained in the case 10 and positioned to maximize the magnetic field coupling from the power cable 12 into the fault indicator sensor. A status display 24 or target is also contained within the case 10 making the display an integral portion of the fault indicator. The status display 24 may also be attached remotely from the case allowing the display to be remotely monitored.

The case 10 and the pressure pad 14 are made of molded plastic making them economical to manufacture. The adjustment screw 16 is made with multiple threads which minimize the number of turns required to tighten the pressure pad.

This detector improves the magnetic circuit of an open lamination, inductive type sensor having a magnetic lamination 30. According to an embodiment of the invention, the pressure pad 14 is made of magnetic metal that is plated to withstand environmental effects. Once tightened into position, the pressure pad 14 serves as a magnetic shunt to the magnetic flux lines generated by the current in the power cable. The pressure pad 14 effectively closes the magnetic circuit and significantly reduces the inherent air gap of the open lamination sensor. The reduced air gap sensor will function in a more sensitive manner compared to the open lamination sensor. FIG. 1 shows the "open" position of the clamp. The cable is positioned through the case opening or cable entrance 26 and moved to the sensor area. FIG. 2 shows the "closed" position of the clamp. The adjustment screw 16 tightens the pressure pad 14 to the cable 12 and closes the magnetic circuit.

This indicator provides a very secure method of attaching fault indicators to power cables for overhead as well as underground utility systems.

While embodiments of the invention have been described in detail it will be evident to those skilled in the art that the invention may be embodied otherwise.

What is claimed is:

1. A fault detector, comprising:
   a casing having a u-shaped portion for receiving a cable, and an extending portion extending from the u-shaped portion;
   a crew mounted on said extending portion;
   a pressure device mounted on the end of the screw and directed toward the u-shaped portion for holding the cable in the u-shaped portion;
   a magnetic lamination passing through the u-shaped portion;
   said pressure device being made of a magnetic material; and
   a coil surrounding said laminations.

2. A fault detector as in claim 1, wherein:
   said pressure device is arranged for entering the u-shaped portion when the pressure device holds the cable in the u-shaped portion.

3. A fault detector as in claim 1, wherein:
   said u-shaped portion has a u-shaped opening for allowing passage of the cable therethrough; and
   said pressure device is substantially as wide as said u-shaped opening.

4. A fault indicator as in claim 2, wherein:
   said u-shaped portion has a u-shaped opening for allowing passage of the cable therethrough; and said pressure device is substantially as wide as said u-shaped opening.

5. A fault indicator as in claim 1, wherein:
said casing includes a status display and circuitry for driving the status display.

6. A fault indicator as in claim 4, wherein:
said casing includes a status display and circuitry for driving the status display.

* * * * *